United States Patent [19]
Horst

[11] Patent Number: 5,930,275
[45] Date of Patent: Jul. 27, 1999

[54] CLOCK ERROR DETECTION CIRCUIT

[75] Inventor: Robert W. Horst, Saratoga, Calif.

[73] Assignee: Tandem Computers Incorporated, Cupertino, Calif.

[21] Appl. No.: 08/659,768

[22] Filed: Jun. 6, 1996

[51] Int. Cl.[6] .............................. G06F 11/00; G06F 9/22
[52] U.S. Cl. ................. 371/62; 395/558; 327/47
[58] Field of Search ................. 371/61, 62, 70; 395/555, 556, 558; 326/93; 341/100; 327/47, 48, 49, 113

[56] References Cited

U.S. PATENT DOCUMENTS

| | | | |
|---|---|---|---|
| 4,777,448 | 10/1988 | Satoh | 327/49 |
| 5,223,833 | 6/1993 | Akata | 341/100 |
| 5,475,322 | 12/1995 | MacDonald | 326/93 |
| 5,663,970 | 9/1997 | Bae | 371/61 |
| 5,670,901 | 9/1997 | Yoshida | 377/80 |

*Primary Examiner*—Trinh L. Tu
*Attorney, Agent, or Firm*—Townsend and Townsend and Crew LLP

[57] ABSTRACT

A method and digital circuit for indicating whether the frequencies of two clocks are within a predetermined range of each other, wherein a first pattern of alternating binary one's and zero's is created using the active edge of the first clock; first and second sampled patterns are generated by sampling the first pattern with respective first and second edges of the second clock; and a first acceptance signal is asserted if either the first or second sampled pattern has alternating binary one's and zero's. A second acceptance signal is asserted as above but interchanging the two clock signals. A near-frequency signal is generated when both acceptance signals are asserted. A clock error signal is the inversion of the near-frequency signal.

6 Claims, 4 Drawing Sheets

CLOCK ERROR DETECTION CIRCUIT

BACKGROUND OF THE INVENTION

The present invention relates to detecting error in the frequency of a clock. More particularly, this invention relates to a digital circuit for detecting when the frequencies of two clocks are within a certain range of each other.

Assume a receiver circuit with differential inputs biased close to the threshold of the receiver. In cases where no cable is connected, the inputs can cause high-frequency oscillation of any outputs and clocks of the receiver. These outputs and clocks can, in turn, drive other circuits, causing extra power dissipation in those circuits or in the receiver itself. The chattering outputs can also cause multiple bit errors in the received data, giving a higher probability that incorrect symbols may escape error detection.

Accordingly, there is a need for a circuit which enables the outputs of a circuit only when the received clock is within a reasonable frequency range.

This and other objects and goals of the invention will be readily apparent to one of ordinary skill in the art on the reading of the background above and the description below.

SUMMARY OF THE INVENTION

Herein is disclosed a purely digital circuit for determining whether two clock signals are within a predetermined range of each other. In one embodiment, the circuit includes a toggle flip-flop which toggles the first of the clock signals clocks. A shift register receives the output of the flip-flop, and the second clock signal clocks the shift register. The shift register produces binary, parallel output. Attendant logic tests the parallel output for alternating ones and zeros which indicate a frequency range. In alternate embodiments, this digital circuit is variously repeated to add robustness in the determination of whether the clock signals are within the predetermined range of each other.

DESCRIPTION OF THE PREFERRED EMBODIMENT

Figure 1:
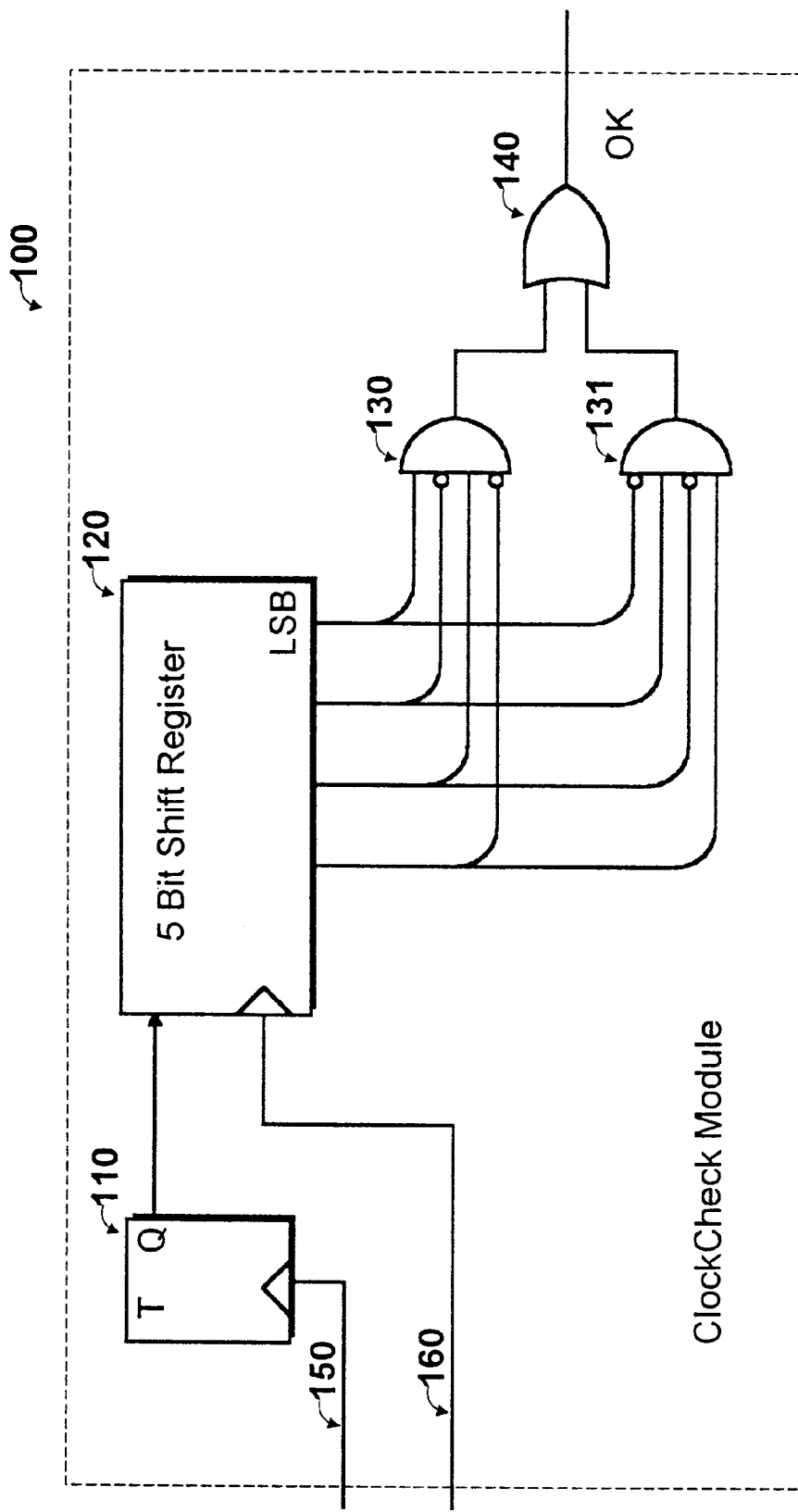
FIG. 1 illustrates a ClockCheck module.

FIG. 1 illustrates a ClockCheck module 100. The ClockCheck module 100 includes an edge-triggered toggle flip-flop 110, a five-bit shift register 120, AND gates 130, 131 and OR gate 140. The flip-flop 110 receives the clock signal under test 150. The output signal Q of the flip-flop 110 is fed into the shift input of the shift register 120. The least-significant and third least-significant bits of the parallel output of the shift register are input for the AND gate 130 and are inverted for input to the AND gate 131. Conversely, the second and fourth most-significant bits of the parallel output of the shift register are input for the AND gate 131 and are inverted for input to the AND gate 130. The outputs of the AND gates 130, 131 are the inputs to the OR gate 140.

At a high level, a ClockCheck module 100 receives as input a clock signal under test 150 and a known clock signal 160 and produces an output 170 when the clock signal under test 150 is at least two-thirds the frequency of the known clock signal 160. More particularly, the clock signal under test 150 toggles the flip-flop 110, generating alternating 0 and 1 pulses at one-half the frequency of the clock signal under test 150. The output Q of the flip-flop 110 feeds the serial input to the shift register 120. The first stage (MSB) of the shift register is a synchronization stage to reduce the chances of metastability. However, the AND gates 130, 131 check the remaining four stages for alternating 0's and 1's, i.e., "0101" or "1010". If either pattern of alternating bits is found, the OR gate 140 indicates that the ClockCheck module 100 has passed the clock signal under test 150 as at least two-thirds the frequency of the known clock signal 160.

Figure 4:
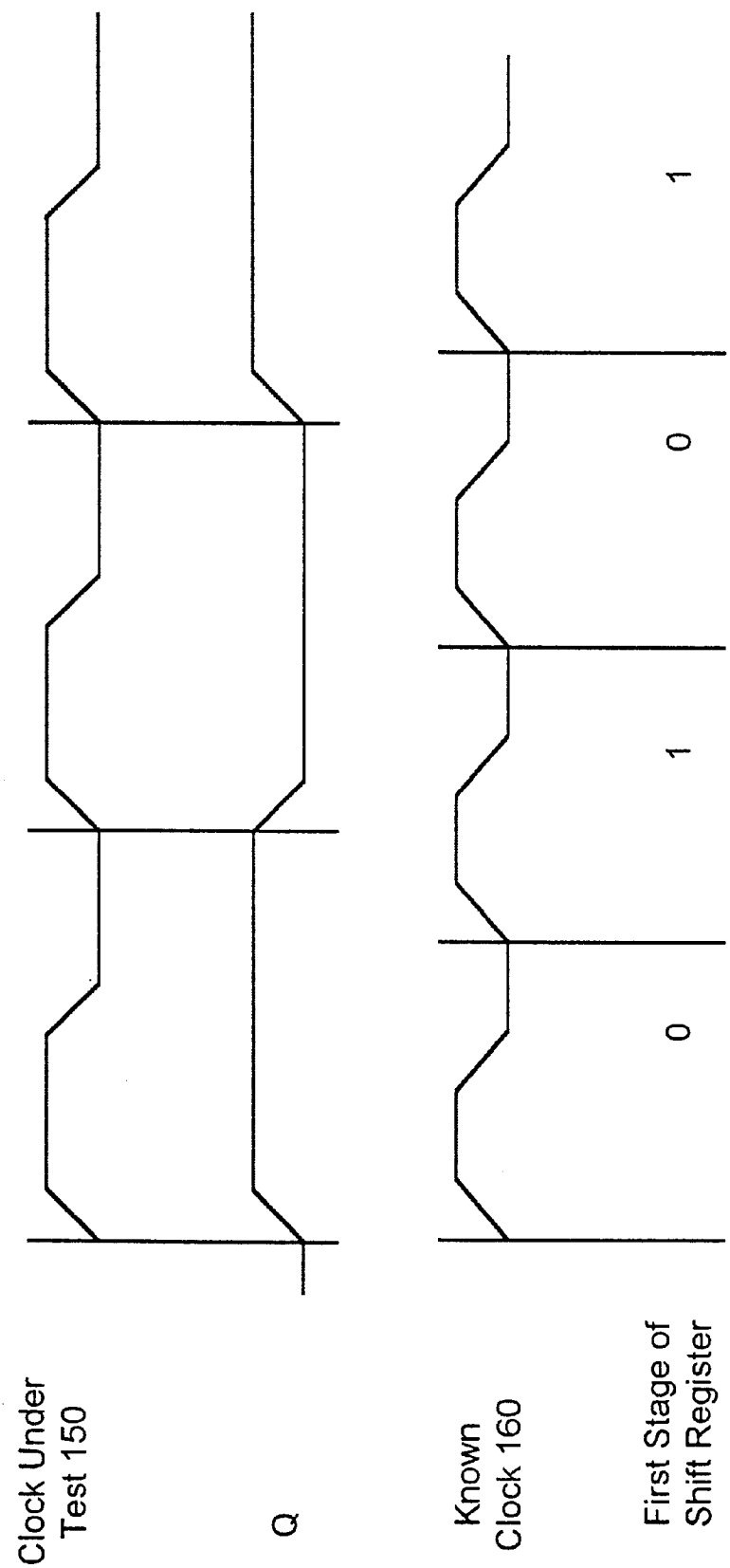
FIG. 4 is a timing diagram for a ClockCheck module.

FIG. 4 is a timing diagram for the ClockCheck module 100. In FIG. 4, the clock signal under test 150 toggles the flip-flop 110 to produce the output signal Q. With Q supplying the serial input of the shift register 120, the known clock signal 160 clocks the shift register 120, producing the indicated output at the first stage of the shift register 120. FIG. 4 is a worst-case timing diagram.

However, when the edges of the known clock signal 160 are very close to changes in the output Q, the ClockCheck module 100 described above may fail to pass the signal under test 150 even though that signal 150 is at least two-thirds the frequency of the known clock signal 160. A single copy of the ClockCheck module 100 is useful when the clock signals 150, 160 are guaranteed to have a predetermined phase relationship. For example, where the signal under test 150 and the known clock signal 160 are in phase with each other, then samples could be taken at opposite edges by inverting either clock or by using either a negative-triggered flip-flop or shift register.

With two copies of the ClockCheck module 100, the phase relationship becomes immaterial. Therefore, an inverted signal under test 150 drives a second copy of the ClockCheck module 100' in order to drive the ClockCheck module on the opposite edge of the clock signal under test 150. If the signal under test 150 is within the acceptable range of the known clock signal 160, then one of the ClockCheck modules 100, 100' will sample the signal under test 150 away from the edges of the signal.

Figure 2:
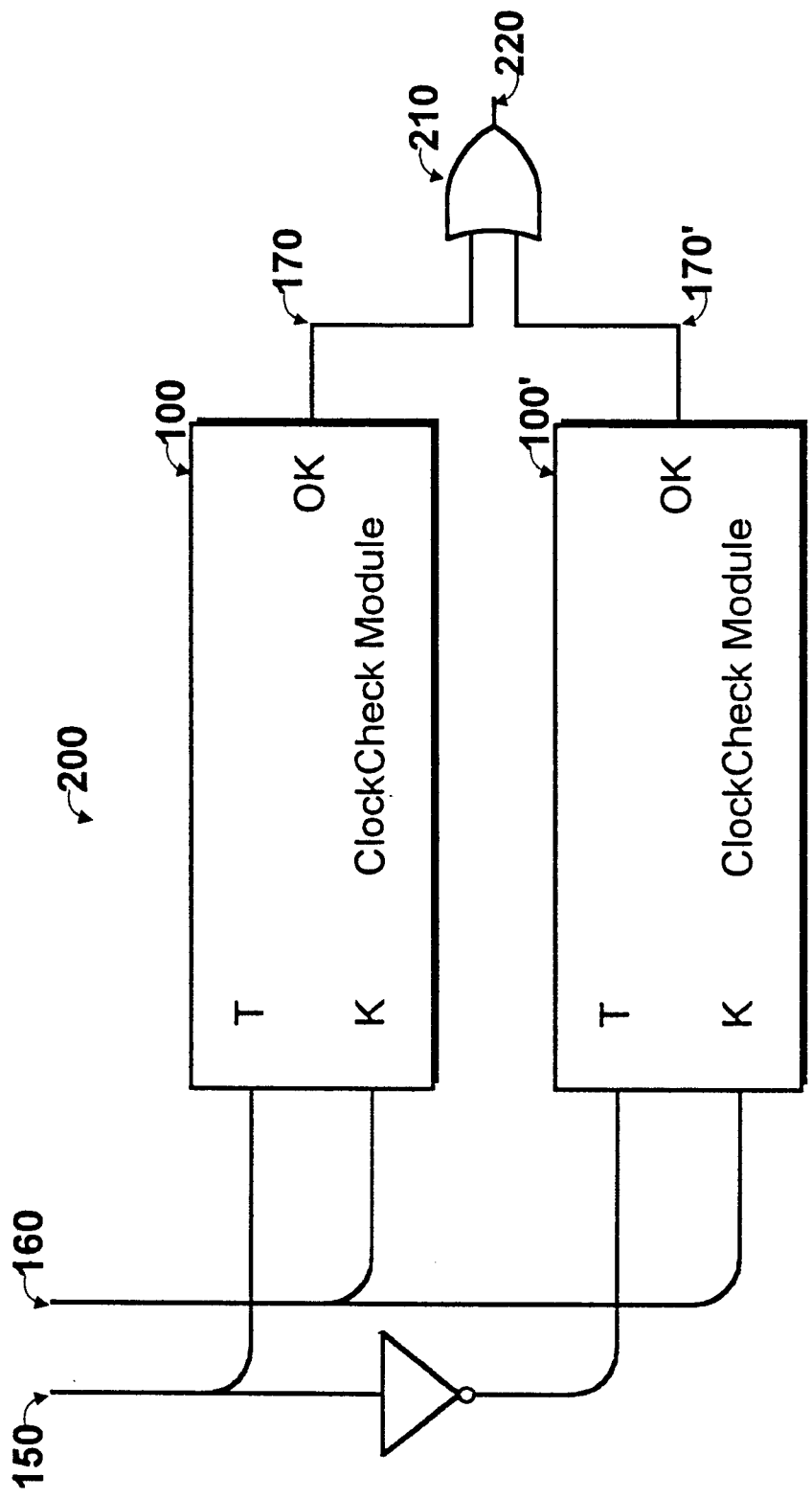
FIG. 2 is a schematic of a two-thirds frequency detection circuit.

FIG. 2 is a schematic of a two-thirds frequency detection circuit 200. In FIG. 2, a first ClockCheck module 100 receives the clock signal under test 150 and a second ClockCheck module 100' receives the inverted clock signal under test 150. Both ClockCheck modules 100, 100' receive the known clock signal 160. The outputs 170, 170' of the ClockCheck modules 100, 100', respectively, are inputs to the OR gate 210. The output of the OR gate 210 is a signal 220 guaranteeing that the input signal under test 150 is at least two-thirds the frequency of the known signal 160.

Even with the two-thirds frequency detection circuit 200, it is possible that the signal 220 may indicate that the clock signal under test 150 is acceptable even when it is not so: The clock signal under test 150 may be much faster than the known clock signal 160, and the samples may coincidentally alternate. Therefore, in order to insure that the clock signals 150, 160 are near in frequency, the two-thirds frequency detection circuit 200 is repeated with the role of the clock signals 150, 160 reversed. The four copies of the module 100 produce signals that assert that the input signal under test 150 is at least two-thirds the frequency of the known signal 160 and vice versa. The four copies of the ClockCheck module 100 guarantee the range of the signal under test 150.

Figure 3:
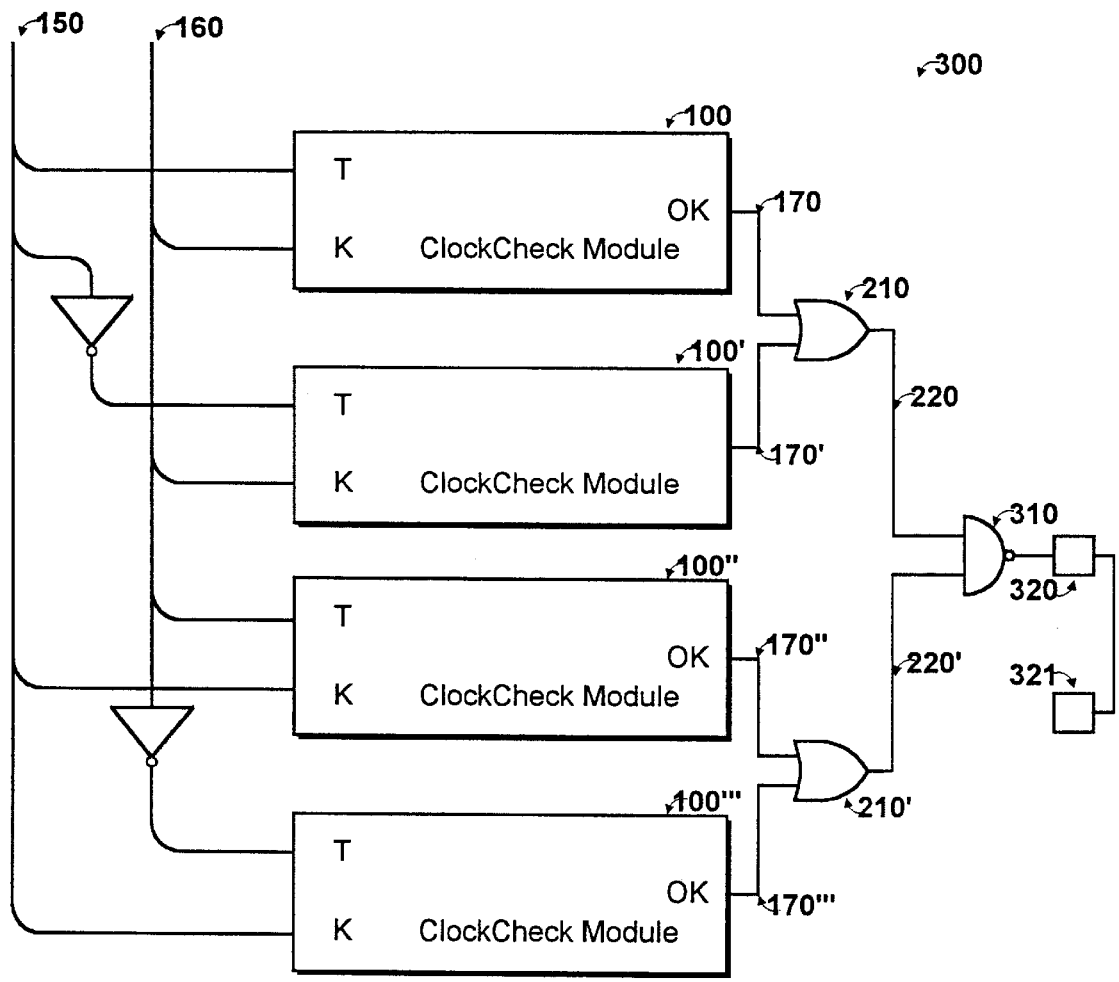
FIG. 3 is a schematic of a clock error detection circuit.

Accordingly, FIG. 3 is a schematic of a clock error detection circuit 300. The clock error detection circuit 300 includes ClockCheck modules 100 and 100' along with additional ClockCheck modules 100" and 100'". The ClockCheck modules 100, 100' and the OR gate 210 are connected as described in FIG. 2. The output of the OR gate 210 is a signal 220 indicating that the input clock signal under test 150 is at least two-thirds the frequency of the known clock signal 160.

The ClockCheck modules 100", 100'" reverse the role of the clock signals 150, 160 for the modules 100' and 100". The ClockCheck module 100'" receives the known clock signal 160 as its clock signal under test T, and the ClockCheck module 100'" receives the inverted known clock signal 160 as its clock signal under test T. Both ClockCheck modules 100", 100'" receive the clock signal under test 150 as their known clock signals K. The outputs 170", 170'"of the ClockCheck modules 100", 100'", respectively, are inputs to the OR gate 210'. The output of the OR gate 210' is a signal 220' indicating that the input clock signal under test 150 is no more than 150% the frequency of the known clock signal 160.

The AND gate 310 ANDs the outputs 220, 220', generating a signal 320 indicating whether the clocks are within a specific frequency range. For example, if the known clock signal 160 is 50 MHz, then the signal 320 indicates whether the clock signal under test 150 is between 33 MHz and 75 MHz.

The precision of the clock error detection circuit 300 can be increased or decreased. A shift register 120' (not shown) can have more or less bits than the above-described embodiment of five. With a shift register 120' with four output bits, the logic gates 130', 131', 140 check for a sequence of "101" or "010". The corresponding range of frequencies is 25 MHz to 100 MHz. However, the corresponding reduction in robustness makes a four-bit shift register 120'less desirable than the five-bit shift register 120. A fault which causes the phase lock loop generating the clock signal under test 150 to generate a different harmonic of the 50 MHz clock is easily imagined. Also, improper clock line termination might result in ringing that could be interpreted as a 100 MHz signal.

Alternatively, the number of output bits of the shift register 120 can be increased. With a shift register 120" (not shown) with six output bits, the frequency range discerned is 37.5 to 66 MHz.

FIG. 3 also illustrates an implementation of the clock error detection circuit 300 in a transceiver IC that sends a clock plus data across a cable to another similar IC. Where the transmitter is broken or the cable disconnected, the received clock may float near threshold or oscillate to cause the receiver to send high-frequency noise. High-frequency oscillations could also cause power dissipation to rise above normal levels. However, enabling receiver output only when the clock received through the cable is near the local clock frequency (the clock that will be sent to the other transceiver) overcomes this problem. Thus, the ClockError pin 320, external to the chip and connected to the NAND 310 output signal, is tied back to the $\overline{\text{OutputEnable}}$ pin 321 that disables the receiver circuit when the clocks are not within range. While the feedback can be internal or external to the IC, making it external has the added benefit that it is available to the maintenance system to signal when cables are connected or disconnected. Further, the signal can automatically switch multiplexers, depending on where cables are actually plugged in. Finally, any error in the logic implementing the clock error detection circuit need not disable the output buffers. The ClockError and $\overline{\text{OutputEnable}}$ pins 320, 321 can be disconnected and the $\overline{\text{OutputEnable}}$ pin 320 tied to ground until the error is corrected.

Alternatively, where the output signal of the NAND 310 is not tied to an external pin (e.g., where no external pin is available for that purpose), the output signal of the NAND 310 can internally gate the receive clock at a point before the receive clock connects to the output register. Such internal gating drives the external clock low and freezes the other outputs at their current values until the clock signals 150, 160 are again within range.

Depending on how the logic is designed, the clock error detection circuit 300 could generate glitches on the output signal of the NAND 310 when one of its input clock signals switches between different phases. Registering the error signal in flip-flops clocked by the appropriate clock avoids these glitches.

Finally, the frequency ranges are described herein as the ranges for which a good clock is guaranteed to produce a good output. However, due to the register setup and hold times, the actual ranges are much narrower.

What is claimed is:

1. A digital circuit indicating whether the respective frequencies of first and second clocks are within a predetermined range of each other, said circuit comprising:
    a toggle flip-flop, clocked by said first clock and producing as output a toggle signal;
    a shift register, receiving as serial input said toggle signal and clocked by said second clock, said shift register having plural outputs for producing a binary parallel output; and
    a logic circuit for testing for alternating binary zeros and ones among said binary parallel output to produce therefrom a signal indicating whether the frequencies of said first and second clocks are within a predetermined range of each other.

2. The digital circuit of claim 1 wherein said logic circuit comprises:
    a first AND gate, receiving as inputs alternating bits of said binary parallel output beginning with the least significant bit and receiving as input the inversion of alternating bits of said binary parallel output beginning with the second least significant bit;
    a second AND gate, receiving as inputs the inversion of alternating bits of said binary parallel output beginning with the least significant bit and receiving as input alternating bits of said binary parallel output beginning with the second least significant bit; and
    an OR gate, receiving as inputs the respective outputs of said first and second AND gates, the output of said OR gate said signal indicating whether the frequencies of said first and second clocks are within a predetermined range.

3. A frequency comparison circuit indicating whether the respective frequencies of first and second clocks are within a predetermined range of one another, the frequency comparison circuit comprising:
    a first digital circuit, including
        a first toggle flip-flop, clocked by said first clock and producing as output a first toggle signal,
        a first shift register, receiving as serial input said first toggle signal and clocked by said second clock, said first shift register having first plural outputs, and
        a first logic circuit for testing for alternating binary zeros and ones among said first plural outputs to produce a first signal;
    a second digital circuit, including
        a second toggle flip-flop, clocked by said second clock and producing as output a second toggle signal, a second shift register, receiving as serial input said second toggle signal and clocked by said first clock, said second shift register having second plural outputs, and a second logic circuit for testing for alternating binary zeros and ones among said second plural outputs to produce a second signal; and a third logic circuit coupled to receive the first and second signals to produce an output signal indicating whether the frequencies of said first and second clocks of said frequency comparison circuit are within a predetermined range.

4. A frequency comparison circuit indicating whether the respective frequencies of first and second clocks are within a predetermined range of one another, the frequency comparison circuit comprising:

first and second digital circuits each including
(a) a toggle flip-flop clocked by a test clock input and producing as output a toggle signal,
(b) a shift register, receiving as serial input said toggle signal and clocked by a reference clock, said shift register having plural outputs,
(c) a first logic circuit for testing alternating binary zeros and ones among said plural outputs to produce a first signal; and a second logic circuit coupled to receive the first signal from the first logic circuit of each of the first and second digital circuits to produce therefrom an output signal indicating whether the frequencies of the first and second clocks are within a predetermined range;

wherein, the first and second clocks are received by the first digital circuit as the test and the reference clock, respectively, and an inversion of the first clock and the second clock are received as the test clock and the reference clock, respectively, by the second digital circuit.

5. The frequency comparison circuit of claim 4, including:
third and fourth digital circuits each including
(a) a toggle flip-flop clocked by a test clock input and producing as output a third toggle signal;
(b) a shift register, receiving as serial input said third toggle signal and clocked by a reference clock, said shift register having first plural outputs;
(c) a logic circuit for testing for alternating binary zeros and ones among said first plural outputs to produce a second signal; and a third logic circuit coupled to receive the second signal from the logic circuit of each of the third and fourth digital circuits to produce an output signal indicating whether the frequencies of the first and second clocks are within a predetermined range;

wherein, the first and second clocks are received by the third digital circuit as the test and the reference clocks, respectively, and an inversion of the second clock and the first clock are received by the fourth digital circuit as the test clock and the reference clock, respectively; and a fifth logic circuit for receiving the outputs of the second and third logic circuits to output a logic signal indicating the first and second clocks are within a predetermined range of one another.

6. A digital circuit indicating whether the respective frequencies of first and second clocks are within a predetermined range of each other, said circuit comprising:

a toggle flip-flop, clocked by said first clock and producing as output a toggle signal;

a shift register, receiving as serial input said toggle signal and clocked by said second clock, said shift register having an output for producing a binary signal; and a logic circuit for testing for alternating binary zeros and ones among said binary signal to produce an output signal indicating whether the frequencies of said first and second clocks are within a predetermined range of each other.

* * * * *